United States Patent
Gupta et al.

(10) Patent No.: US 11,101,634 B2
(45) Date of Patent: Aug. 24, 2021

(54) PREVENTION AND DETECTION OF OVERHEATING FROM COMPONENT SHORT CIRCUITS

(71) Applicant: Apple Inc., Cupertino, CA (US)

(72) Inventors: Vishal Gupta, Sunnyvale, CA (US); Timothy M. Johnson, San Jose, CA (US); Sivasankari Krishnanji, Santa Clara, CA (US)

(73) Assignee: Apple Inc., Cupertino, CA (US)

( * ) Notice: Subject to any disclaimer, the term of this patent is extended or adjusted under 35 U.S.C. 154(b) by 263 days.

(21) Appl. No.: 16/201,454

(22) Filed: Nov. 27, 2018

(65) Prior Publication Data

US 2020/0106257 A1 Apr. 2, 2020

Related U.S. Application Data

(60) Provisional application No. 62/737,354, filed on Sep. 27, 2018.

(51) Int. Cl.
| | |
|---|---|
| *H02H 3/08* | (2006.01) |
| *H02H 1/00* | (2006.01) |
| *H05K 5/00* | (2006.01) |
| *H05K 1/14* | (2006.01) |
| *H05K 1/18* | (2006.01) |
| *H05K 1/02* | (2006.01) |

(Continued)

(52) U.S. Cl.
CPC ....... *H02H 3/085* (2013.01); *G01R 19/16542* (2013.01); *G05B 19/0428* (2013.01); *G08B 21/182* (2013.01); *H02H 1/0007* (2013.01); *H02H 3/10* (2013.01); *H05K 1/028* (2013.01); *H05K 1/14* (2013.01); *H05K 1/181* (2013.01); *H05K 5/0086* (2013.01); *G05B 2219/21156* (2013.01); *G06F 1/1613* (2013.01); *G06F 1/189* (2013.01); *H02H 1/0092* (2013.01); *H02H 3/04* (2013.01); *H02H 5/041* (2013.01); *H02H 7/20* (2013.01); *H02J 2207/20* (2020.01); *H05K 2201/10151* (2013.01)

(58) Field of Classification Search
CPC .. H02H 1/0007; H02H 1/0038; H02H 1/0092; H02H 3/04; H02H 3/085; H02H 5/041; H02H 7/20

See application file for complete search history.

(56) References Cited

U.S. PATENT DOCUMENTS

| | | | |
|---|---|---|---|
| 9,679,885 B2 | 6/2017 | Lidsky | |
| 2010/0157709 A1* | 6/2010 | Kim | G11C 29/02 |
| | | | 365/212 |

(Continued)

*Primary Examiner* — Rafael O De Leon Domenech
(74) *Attorney, Agent, or Firm* — Blank Rome LLP

(57) ABSTRACT

A personal electronic device can include a main printed circuit board having disposed thereon a processing unit, one or more auxiliary circuits coupled to the main printed circuit board by one or more corresponding flexible printed circuits and one or more temperature sensors disposed on one of the flexible printed circuits. A processing unit of the portable electronic device can be configured to monitor the one or more temperature sensors, provide a warning in response to a monitored temperature exceeding a first threshold, and to cause a shutdown of at least a portion of the personal electronic device in response to the monitored temperature exceeding a second threshold. The temperature sensors can be negative temperature coefficient resistors.

25 Claims, 4 Drawing Sheets

(51) Int. Cl.
  *G01R 19/165* (2006.01)
  *G05B 19/042* (2006.01)
  *G08B 21/18* (2006.01)
  *H02H 3/10* (2006.01)
  *G06F 1/16* (2006.01)
  *G06F 1/18* (2006.01)
  *H02H 3/04* (2006.01)
  *H02H 5/04* (2006.01)
  *H02H 7/20* (2006.01)

(56) References Cited

U.S. PATENT DOCUMENTS

| | | |
|---|---|---|
| 2012/0272086 A1 | 10/2012 | Anderson |
| 2013/0082662 A1 | 4/2013 | Carre |
| 2014/0340100 A1* | 11/2014 | Popa .................... G01R 27/00 |
| | | 324/691 |
| 2016/0378165 A1 | 12/2016 | Krishnappa |
| 2017/0294691 A1 | 10/2017 | Yamamoto |
| 2017/0346478 A1 | 11/2017 | Steiner |
| 2018/0034267 A1 | 2/2018 | Vasefi |
| 2018/0062626 A1* | 3/2018 | Hunter .................... H03B 5/24 |
| 2018/0123385 A1 | 5/2018 | Akiyama |
| 2018/0294638 A1* | 10/2018 | Jiang .................... H02H 5/042 |
| 2019/0356128 A1* | 11/2019 | Shimizu ................. H02H 7/205 |
| 2020/0225295 A1* | 7/2020 | Hyun ................. H01R 13/648 |

\* cited by examiner

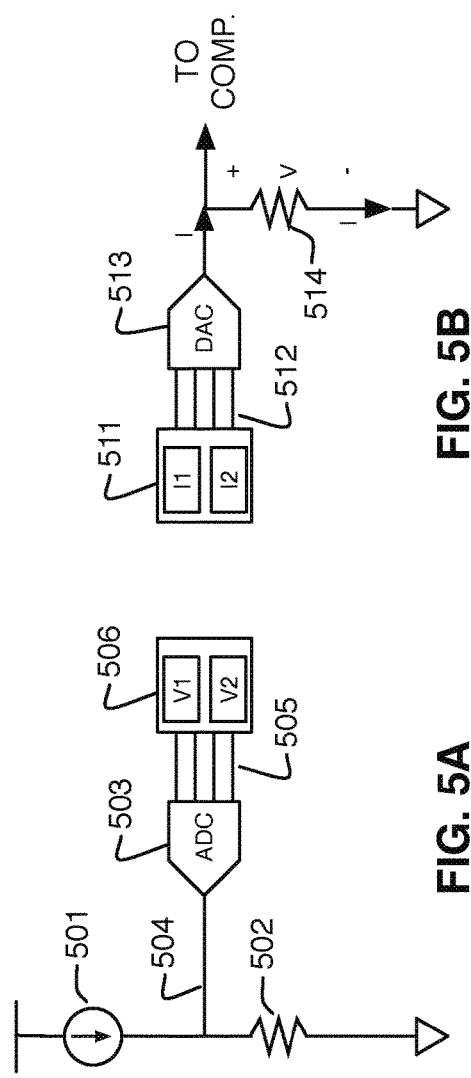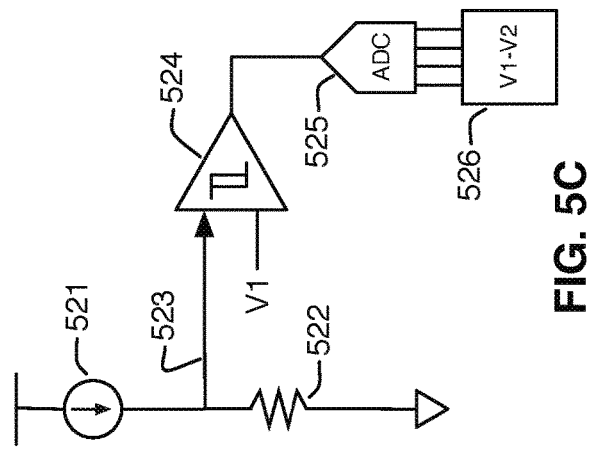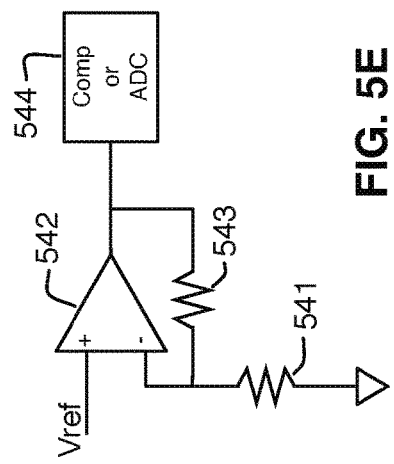
FIG. 5A
FIG. 5B
FIG. 5C
FIG. 5D
FIG. 5E

PREVENTION AND DETECTION OF OVERHEATING FROM COMPONENT SHORT CIRCUITS

BACKGROUND

The recent proliferation of personal electronic devices has resulted in a significant increase in the number of electronic devices with which a user shares close physical proximity and often physical contact. For example, fitness monitors, smart watches, and other wearable devices may be in physical contact with a user for all or a significant portion of the day. As a result, operating conditions and/or malfunctions of the various components within a personal electronic device may result in conditions that physiologically affect the user. One example can arise from an electrical fault (e.g., a short circuit) within a component of the personal electronic device. Such electrical faults can arise from manufacturing defects, component aging, or other damage. The electrical fault can cause excessive current flow through the component, leading to unwanted power dissipation and an associated temperature increase that may cause discomfort to a user.

In such cases, it may be desirable to shut down the portable electronic device to prevent further damage to the device and/or discomfort to the user. It may also be desirable for the electronic device to log the shutdown event and other data associated therewith and/or for the device to communicate to the user that the device should be returned for servicing. However, the extreme space constraints associated with personal electronic devices, and particularly with wearable personal electronic devices, may complicate the addition of further fault detection and mitigation circuitry. Thus, what is needed in the art are improved techniques for detecting and isolating faults within a personal electronic device.

SUMMARY

A personal electronic device can include a main printed circuit board having thereon a processing unit, one or more auxiliary circuits coupled to the main printed circuit board by one or more corresponding flexible printed circuits and one or more temperature sensors disposed on one of the flexible printed circuits. A processing unit of the portable electronic device can be configured to monitor the one or more temperature sensors, provide a warning in response to a monitored temperature exceeding a first threshold, and to cause a shutdown of at least a portion of the personal electronic device in response to the monitored temperature exceeding a second threshold. The temperature sensors can be negative temperature coefficient resistors. The processing unit can be a system on a chip.

The personal electronic device can further include a battery and a power regulator. The processing unit disposed on the main printed circuit board can be a power management unit configured to control the power regulator to power the personal electronic device from the battery. The main printed circuit board can have disposed thereon a system on a chip in addition to the power management unit.

The personal electronic device can be a wearable device, such as a smartwatch.

The personal electronic device may be further configured to provide a warning in response to a monitored temperature exceeding the first threshold by at least one of: logging an overtemperature warning in a memory of the personal electronic device and providing visual or audible feedback to a user of the portable electronic device, the visual or audible feedback indicating an overtemperature warning. The personal electronic device may be further configured to cause a shutdown of at least a portion of the personal electronic device in response to the monitored temperature exceeding a second threshold by at least one of: logging a shutdown event in a memory of the personal electronic device, shutting down at least a portion of the personal electronic device, and providing visual or audible feedback to a user of the portable electronic device, the visual or audible feedback indicating an overtemperature shutdown. The personal electronic device can be further configured cause the personal electronic device to restart in a debug mode.

In other embodiments, a personal electronic device can include a battery, a regulator coupled to the battery and configured to power a plurality of loads, and a power management unit configured to operate the regulator to power the plurality of loads. The power management unit can be configured to monitor at least one of a current or power supplied by the battery to the regulator or at least one of a current or power supplied by the battery to the plurality of loads and to compare the monitored current or power to an expected current or power draw corresponding to an operating state of the personal electronic device to detect an electrical fault with a component of the personal electronic device. The power management unit may be integrated with the regulator. Two or more of the plurality of loads are powered by a common bus from the regulator. The power management unit may be configured to detect an electrical fault with a component of the personal electronic device by providing a warning in response to the monitored current or power exceeding the expected current or power draw corresponding to the operating state of the personal electronic device by a first threshold, and causing a shutdown of at least a portion of the personal electronic device in response to the monitored current or power exceeding the expected current or power draw corresponding to the operating state of the personal electronic device by a second threshold.

The processing unit may be further configured to provide a warning in response to the monitored current or power exceeding the expected current or power draw corresponding to the operating state of the personal electronic device by a first threshold by logging an overtemperature warning in a memory of the personal electronic device, and providing visual or audible feedback to a user of the portable electronic device, the visual or audible feedback indicating an overtemperature warning. The processing unit may be further configured to cause a shutdown of at least a portion of the personal electronic device in response to the monitored current or power exceeding the expected current or power draw corresponding to the operating state of the personal electronic device by a second threshold by logging a shutdown event in a memory of the personal electronic device, shutting down at least a portion of the personal electronic device, providing visual or audible feedback to a user of the portable electronic device, the visual or audible feedback indicating an overtemperature shutdown; and causing the personal electronic device to restart in a debug mode. The visual or audible feedback indicating an overtemperature shutdown may indicate that a user should return the personal electronic device for service.

In still other embodiments, a method of detecting and mitigating an electrical fault in a component of a personal electronic device can include monitoring a temperature of at least one temperature sensor disposed on a flexible printed circuit connecting a main printed circuit board of the personal electronic device to an auxiliary circuit of the personal electronic device, providing a warning in response to the monitored temperature exceeding a first threshold, wherein providing a warning further includes logging an overtemperature warning in a memory of the personal electronic device and providing visual or audible feedback to a user of the portable electronic device, the visual or audible feedback indicating an overtemperature warning. Detecting and mitigating an electrical fault in a component of the personal electronic device can further include causing a shutdown of at least a portion of the personal electronic device in response to the monitored temperature exceeding a second threshold, wherein causing a shutdown further includes logging a shutdown event in a memory of the personal electronic device, shutting down at least a portion of the personal electronic device, and providing visual or audible feedback to a user of the portable electronic device, the visual or audible feedback indicating an overtemperature shutdown. Causing a shutdown can further include causing the personal electronic device to restart in a debug mode. The one or more temperature sensors can be negative temperature coefficient resistors.

BRIEF DESCRIPTION OF THE DRAWINGS

FIGS. 5A, 5B, 5C, 5D, and 5E illustrate a series of fault detection circuits.

DETAILED DESCRIPTION

Figure 1:
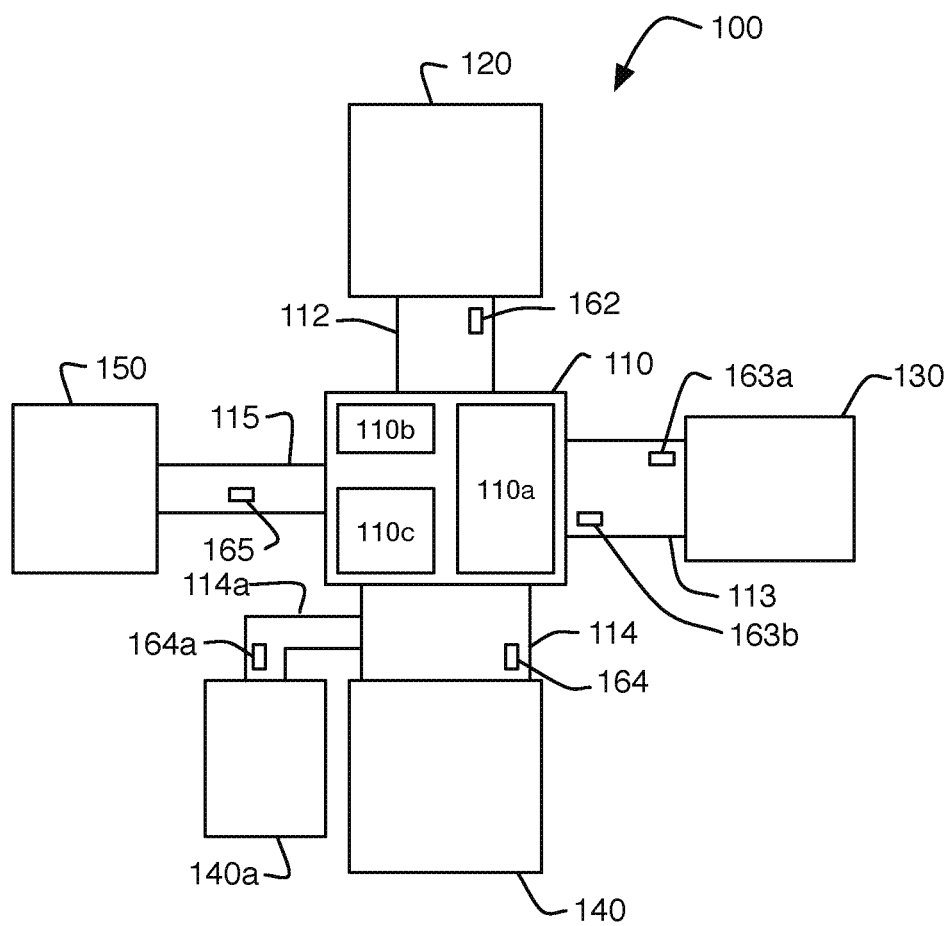
FIG. 1 illustrates a personal electronic device.

In the following description, for purposes of explanation, numerous specific details are set forth to provide a thorough understanding of the disclosed concepts. As part of this description, some of this disclosure's drawings represent structures and devices in block diagram form for sake of simplicity. In the interest of clarity, not all features of an actual implementation are described in this disclosure. Moreover, the language used in this disclosure has been selected for readability and instructional purposes, has not been selected to delineate or circumscribe the disclosed subject matter. Rather the appended claims are intended for such purpose.

Various embodiments of the disclosed concepts are illustrated by way of example and not by way of limitation in the accompanying drawings in which like references indicate similar elements. For simplicity and clarity of illustration, where appropriate, reference numerals have been repeated among the different figures to indicate corresponding or analogous elements. In addition, numerous specific details are set forth in order to provide a thorough understanding of the implementations described herein. In other instances, methods, procedures and components have not been described in detail so as not to obscure the related relevant function being described. References to "an," "one," or "another" embodiment in this disclosure are not necessarily to the same or different embodiment, and they mean at least one. A given figure may be used to illustrate the features of more than one embodiment, or more than one species of the disclosure, and not all elements in the figure may be required for a given embodiment or species. A reference number, when provided in a given drawing, refers to the same element throughout the several drawings, though it may not be repeated in every drawing. The drawings are not to scale unless otherwise indicated, and the proportions of certain parts may be exaggerated to better illustrate details and features of the present disclosure.

FIG. 1 illustrates various components of a personal electronic device 100. Personal electronic device 100 may include a main printed circuit board 110, which may be connected to a plurality of auxiliary circuit boards or components 120, 130, 140, 140a, and 150 via a plurality of corresponding flexible printed circuits 112, 113, 114, 114a, and 115. Main printed circuit board 110 may have disposed thereon a variety of components, including a system on a chip (SoC) 110a. SoC A10a may include a processor (or processors), memory, input/output controllers and interfaces, and communication interfaces. The processor (or processors) may include a CPU for executing general purpose instructions, a GPU for executing graphics-related instructions (or general purpose computing instructions), and one or more other specialized processors for particular processing tasks. Any or all of the processors may be single core or multi-core processors. The memory may include random access memory (RAM) for storing the data being acted upon by the processors and may also include storage memory in the form of flash memory or other non-volatile or read only memory. The input/output controllers and interfaces may include controllers and interfaces for a display, one or more buttons, a touch screen, audio speakers, and/or other I/O devices. The communication interfaces may include various wired or wireless interfaces, such as universal serial bus (USB), wireless networking (WiFi, Bluetooth, etc.), and the like. The communication interfaces may include further interfaces such as cellular data, etc.

Also located on main printed circuit board 110 may be a power regulator 110b (discussed in greater detail below) and a transducer 110c. Power regulator 110b may be used to convert electrical energy from a battery in the personal electronic device to an appropriate voltage and current for the various components of the personal electronic device. In some embodiments, power regulator 110b may also operate to receive a power input via a wired or wireless connection and convert the power input to a level suitable for charging the battery. Power regulator 110b may include a power management unit (PMU) for controlling the power regulator, or a separate PMU may be provided. Transducer 110c may be used to provide mechanical communication, such as vibrations or other tactile or haptic feedback to the user in response to various conditions, such as arrival of a message, reminders about an appointment, etc. In one embodiment, personal electronic device 100 may be a smartwatch/fitness monitor device, such as the Apple Watch, offered for sale by Apple Inc. of Cupertino, Calif.

In the case of a watch implementation, the main printed circuit board 110, auxiliary circuit boards or components 120, 130, 140, 140a, and 150, and flex circuits 112, 113, 114, 114a, and 115 may be folded to fit within a watch case (not shown). As a non-limiting example, auxiliary circuit board 120 may include the display and touchscreen components and flex circuit 112 may be folded over so that auxiliary circuit board 120 is located above main circuit board 110 and forms or is in proximity to a face of the watch case. Similarly, auxiliary printed circuit board 140 may include components related to a heartrate monitor or other sensors that require physical contact with a user. Thus, flex circuit 114 may be folded under so that auxiliary circuit board 140 is located below main circuit board 110 and is in contact or proximity with the back of the watch case, and thus the user. Auxiliary circuitry 130 may include circuitry associated with controls on one side of the watch, such as a rotating crown and/or one or more pushbuttons. Similarly, auxiliary circuitry 150 may include circuitry associated with other input or output devices such as a loudspeaker, microphone, etc. Flex circuits 113 and 115 may be bent as necessary so that auxiliary circuits 130 and 150 may be disposed as necessary to accommodate the physical design of the watch. In some embodiments, there may be flex connectors that branch off of other flex connectors. For example, a battery 140a may be connected via flex circuit 114a to flex circuit 114, which connects to main printed circuit 110, and specifically to power regulator 110b. It will be appreciated by those skilled in the art that the foregoing describes one non-limiting example of how a personal electronic device may be arranged, and that other arrangements are also possible and may be desirable for particular implementations.

In some cases, a component of the personal electronic device may develop an electrical fault (an internal short circuit, for example), that causes an excessive current draw. This excessive current draw can cause a single component to draw an amount of power approaching or even greater than the normal power draw of the entire personal electronic device. This excessive current draw can cause a temperature increase that may physiologically impact the user. The level of current that can cause a user-physiology-affecting temperature increase may be different for different components, based on the proximity of that component to the user. For example, in a watch application, a significant temperature rise in a component on the watch back may be more likely to affect the user than the same temperature rise in a component on the watch face. (Although it will be appreciated that the user may interact with all sides of the personal electronic device at varying times.) Additionally, a device drawing an abnormal current that is located near a thermally conductive element (e.g., a metallic watch case) may have greater effect on the temperature increase felt by the user than one that is surrounded by thermally non-conductive materials. Thus, it may be desirable to monitor the temperatures of various elements of the personal electronic device and shutdown those components and/or the device when an abnormally high temperature (as might be caused by an electrical fault is detected.

Temperature Sensors in Flex Circuits

In some cases, electronic components may have their own internal temperature monitoring components. For example, SoC 110a may include temperature sensors deployed within it to monitor the temperature of processor cores, radio transmitters, and the like. However, for many auxiliary components, such internal temperature sensors may not be available. Additionally, due to space availability or other physical constraints, it may not be feasible to install temperature sensor devices on the various auxiliary printed circuit boards or components, 120, 130, 140, 140a, and 150. However, in such cases, thermal effects of an increased current draw by a component may be detected by disposing temperature sensors in the flexible printed circuit connectors that couple the auxiliary device to the main printed circuit board. In the example illustrated in FIG. 1, temperature sensor 162 may be disposed in flex circuit 112, Two temperature sensors 163a and 163b may be disposed in flex circuit 113. Temperature sensors 164, 164a, and 165 may be disposed in flex circuits 114, 114a, and 115, respectively. Each of these temperature sensors may be used to detect an increase in temperature of a corresponding auxiliary circuit board or component. As described in greater detail below, upon detection of such an increase, action may be taken to reduce or eliminate the physiological effect of such temperatures on the user.

Temperature sensors 162, 163a, 163b, 164, 164a, and 164 may take a variety of forms. The most commonly used electronic temperature sensors are negative temperature coefficient (NTC) thermistors/resistors, resistance temperature detectors (RTDs), thermocouples, and various semiconductor based sensors. Semiconductor based sensors may be integrated within various components. Thermocouples may be advantageous in that they are operable over wider temperature ranges than other solutions. RTDs can provide highly accurate temperature readings. NTC resistors may exhibit relatively large, predictable, and precise changes in resistance that correlate with variation in temperature. Additionally, as temperature increase, the resistance of an NTC resistor decreases rapidly. As a result, relatively small temperature changes can be detected quickly and accurately. Additionally, NTC resistors can be sufficiently compact that incorporation into flex circuits is facilitated.

Thus, in some embodiments, temperature sensors 162, 163a, 163b, 164, 164a, and 166 may be implemented, for example, as negative temperature coefficient (NTC) resistors disposed respectively in flex circuits 112, 113, 114, 114a, and 115. One temperature sensor may be provided for each circuit, component, or group of circuits or components for which temperature monitoring is desired, which may include those circuits for which an electrical fault would cause a temperature increase that would physiologically impact a user. The temperature sensors may be placed on the flex circuit at any suitable location, taking into account proximity to the monitored component, proximity to other components that might interfere with the measurement, bending of the flex circuit, and other factors. As shown in FIG. 1, temperature sensor 162 is disposed in flex circuit 112 near auxiliary circuit/board 120. Temperature sensor 165 is disposed in the middle of flex circuit 115. Flex circuit 113 includes two temperature sensors 163a (located proximate auxiliary circuit/board 130) and 163b (located proximate main board 110). It will be appreciated that although it is possible to incorporate multiple temperature sensors in each flex circuit, it may be desirable in some implementations to have only a single temperature monitor in each flex. In some embodiments, it may be desirable to not have a temperature sensor in a given flex circuit if that flex circuit does not supply a system or component for which temperature monitoring is desired.

Figure 2:
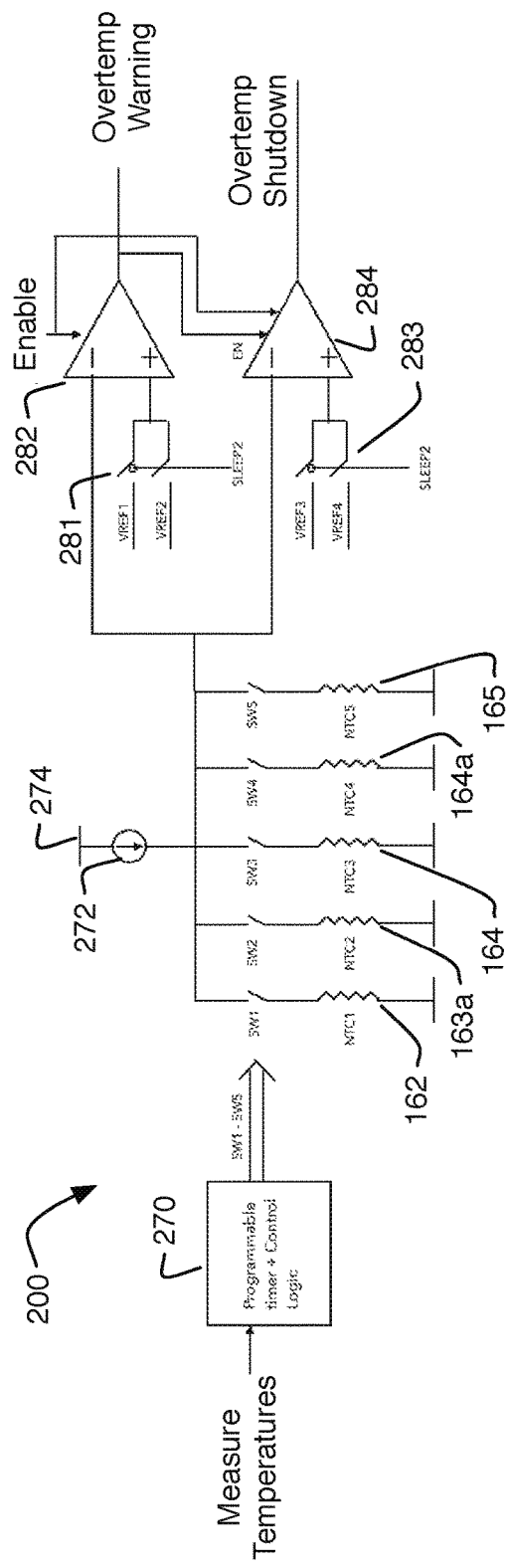
FIG. 2 illustrates a fault detection circuit for a personal electronic device.

FIG. 2 illustrates a circuit for monitoring the temperatures of the temperature sensors 162, 163a, 164, 164a, and 164. This temperature monitoring circuit may be located in the power management unit (PMU). PMU-based temperature monitoring can have several advantages. First, some embodiments may already have certain temperature sensors in place and being monitored by the PMU, and thus there may be certain structures and systems in place to facilitate temperature monitoring. Additionally, by incorporating the temperature monitoring and related alarm and shutdown functions into the PMU, protection may be more power efficient, more highly available, more reliable, and/or faster than if serviced by another system. For example, by incorporating temperature sensing in the PMU, protection will be available even when the SoC is off (such as a processor in the SoC, which may have other workloads and/or be unavailable at certain times).

With continued reference to the PMU circuitry illustrated in FIG. 2, each temperature sensor 162, 163a, 164, 164a, and 164 may be coupled to a corresponding switch SW1, SW2, SW3, SW4, and SW5, respectively. The switches SW1-SW5 may be operated by timer/control logic 270. Timer/control logic 270 may close switches SW1-SW5 one at a time in sequence. Closing a switch allows current from current source 272 (coupled to voltage rail 274) to flow through one of the temperature sensors. This produces a voltage that is coupled to the (inverting) input of warning comparator 282 and to the (inverting) input of shutdown comparator 284. A series of reference voltages VREF1 and VREF2 may be selectively coupled to the (non-inverting) input of warning comparator 282. Similarly, a series of reference voltages VREF3 and VREF4 may be selectively coupled to the (non-inverting) input of shutdown comparator 284. The reference voltages to which the various temperature sensor voltages are compared form the thresholds for generating an overtemperature warning (comparator 282) or an overtemperature shutdown (comparator 284).

Multiple reference voltages may be provided so that different voltage thresholds (and therefore temperature thresholds) may be used for the temperature warning and temperature shutdown triggers for different components corresponding to the different temperature sensors. Switches 281 may be operated to couple any one of the overtemperature warning reference voltages VREF1 or VREF2 to warning comparator 282. Similarly, switches 283 may be operated to couple any one of the overtemperature shutdown reference voltages VREF3 or VREF4 to shutdown comparator 284. Although two reference voltages are illustrated for both the warning and shutdown comparators, a single reference voltage may be used for all temperature sensors, a different reference voltage may be used for each temperature sensors, or some temperature sensors may have a unique reference voltage, while others have a shared reference voltage. The switches 281 and 283 coupling the reference voltages to their respective comparators may also all be selectively opened to decouple the reference voltages from the comparators reducing the quiescent power consumption of the circuit when thermal measurements are not being made. In alternative embodiments, switches SW1-SW5 may be opened to reduce quiescent current when measurements are not being made. In some embodiments, to further reduce quiescent power consumption, an enable signal may be provided to warning comparator 282 and shutdown comparator 284 to prevent the comparators from operating when temperature measurements are not being made. Furthermore, shutdown comparator 284 may be further disabled until it receives an enable signal from the output of warning comparator 282, meaning that shutdown comparator 284 does not operate until warning comparator 282 has been triggered by a warning-level over temperature condition.

As an alternative to the circuitry illustrated in FIG. 2, other temperature comparison circuit structures could be implemented in the PMU. In one embodiment digital to analog converters (DACs) with programmable settings for each temperature sensor could be used to apply different references to the non-inverting terminal of the comparator. In other embodiments, instead of comparators, a finite state machine driving a switch matrix to the input of an analog to digital converter (ADC) could be used, allowing the overtemperature comparisons to be performed in the digital domain.

A variety of temperature sensing circuits are illustrated in FIGS. 5A-5E. FIG. 5A includes a constant current source 501 that drives current through a temperature sensor, such as NTC resistor 502. Analog to digital converter 503 is configured to sample the analog voltage 504 generated across temperature sensor 502 relative to ground and convert this sampled value to a digital reading 505. This digital reading may then be compared by a processing element 506 to one or more voltage thresholds V1 and V2, such as an overtemperature warning threshold and an overtemperature shutdown threshold as discussed above. The processing element 506 may be control logic implemented the power management unit, either as discrete logic circuitry, a field programmable gate array, a programmed processor, or other suitable circuit structure. In other embodiments, processing element 506 may be part of a processing element of the electronic device, such as a CPU or other processing component.

FIG. 5B illustrates an alternative sensing circuit structure in which a digital current source 511 may generate one or more programmed current values I1, I2. These digitally programmed current values 512 are input into digital to analog converter 513. Digital to analog converter 513 generates an output current I that is driven through a temperature sensor, such as NTC resistor 514. As in the embodiments described above, this generates a voltage V, that may be measured by comparator circuitry (not shown) similar to that described above with respect to FIG. 2. In this embodiment, the digitally programmed current source may be configured to provide different currents to different temperature sensors (not shown) to provide for improved sensing in arrangements where different levels of sensitivity are desirable.

FIG. 5C illustrates yet another alternative sensing circuit structure. In FIG. 5C, a current source 521 drives a constant current through temperature sensor 522, which may be an NTC resistor. This generates a voltage 523 that is a function of temperature. The voltage 523 is input into a hysteretic comparator 524. Hysteretic comparator 524 compares the sensed voltage 523 to reference voltage V1. The output of hysteretic comparator 524 is delivered to analog to digital converter 525, which converts the analog output of the hysteretic comparator to a digital value that is provided to processing element 526. As above, processing element 526 may preferably be part of the PMU, or, in other embodiments, may be part of another component of the electronic device. Processing element may monitor the hysteretic comparator output to detect an overtemperature warning or shutdown condition as described above.

FIG. 5D illustrates still another alternative temperature sensing circuit structure. In FIG. 5D, the temperature sensor, e.g., NTC resistor 533 is incorporated into an oscillator circuit. More specifically, a voltage rail 531 is divided by the series combination of a capacitor 532 and temperature sensor 533. Capacitor 532 may start in a discharged, i.e., zero voltage state. As capacitor 532 charges, voltage 504 provided to the inverting input of an operational amplifier 535, will decrease, ultimately reaching zero when capacitor 532 is fully charged to the rail voltage 531. This action will produce a corresponding inverted voltage (i.e., increasing voltage) at the output of operational amplifier 533. When the output of operational amplifier 535 reaches a predetermined threshold, switching device 534 may be activated, which discharges capacitor 532 and pulls voltage 504 up to the voltage of rail 531. This also forces the output of operational amplifier 535 low. Switch 534 then opens, and the cycle repeats. The resistance value of temperature sensor 533, which varies with temperature, can determine the rate at which capacitor 532 charges, which determines the frequency of the oscillations appearing at the output of operational amplifier 535. Frequency detector 536 may be provided to determine the frequency of the output of operational amplifier 535, which is a function of the temperature detected. This temperature measurement may then be compared against warning and shutdown thresholds as described above.

FIG. 5E illustrates one further temperature sensing circuit structure. In the temperature sensing circuit of FIG. 5E, temperature sensor 541 (e.g., an NTC resistor) is incorporated into the feedback loop of operational amplifier 542. The feedback loop also includes fixed resistance 543. As the resistance value of temperature sensor 541 changes with temperature, the gain of operational amplifier 542 will change proportionally. With a fixed voltage Vref provided to the other input of the operational amplifier, the voltage appearing at the output will be Vref times the gain of operational amplifier. The output voltage from operational amplifier 542 may be provided to a comparator or analog to digital converter 544 in accordance with one of the embodiments described above.

The PMU circuitry illustrated in FIGS. 2 and 5 and described above may be operated as follows to provide temperature protection for a portable electronic device. A measure temperature signal may be received by programmable timer and control logic 270. The measure temperatures signal may also be provided as an enable signal to overtemperature warning comparator 282 and overtempt shutdown comparator 284 as described above. When programmable controller 270 receives the measure temperature signal it may provide drive signals to sequentially close and open each of switches SW1, SW2, SW3, SW4, and SW5 to allow current source 272 to individually flow through the temperature sensors 162, 163, 164, 164a, and 165, respectively. The flow of fixed current from current source 272 will produce a voltage that is a function of temperature sensed by the respective temperature sensors. This voltage may fed to overtemperature warning comparator 282 and overtemperature shutdown comparator 284 and compared to the selected thresholds as discussed above. If the sensed voltage exceeds an overtemperature warning threshold, the output of overtemperature warning comparator 282 may provide an overtemperature warning signal to any suitable component within the personal electronic device. If the sensed voltage exceeds an overtemperature shutdown threshold, the output of the overtemperature shutdown comparator 284 may provide an overtemperature shutdown signal to the PMU, causing a shutdown of the personal electronic device.

In other embodiments, instead of or in addition to comparing the measured temperature to selected thresholds to determine an overtemperature warning or overtemperature shutdown condition, the rate of change of temperature over consecutive measurement cycles may be used to further characterize a fault condition. For example, a higher rate of temperature rise may be more indicative of a fault. Additionally, by relying on rate of rise instead of or in addition to a simple threshold comparison, it may be possible to prevent false alarms associated with a user entering a substantially warmer environment with the personal electronic device. Implementation of a system relying on rate of change may incorporate a sampling and analog to digital converter circuit for sampling and storing the various temperature measurements in a memory accessible by the SoC or PMU, and additional programming or other configuration within the SoC or PMU to analyze samples to determine a rate of change, with a suitable rate of change threshold being used to trigger an overtemperature warning or overtemperature shutdown condition.

Programmable timer and control logic 270 may provide suitable timing for the temperature signals. For example, it may be desirable to provide continuous scanning of the various temperature sensors. In such an application, the programmable timer and control logic may cycle through each temperature sensor in a round robin fashion, such that each sensor is read for a portion of the total round robin cycle time. In general, the round robin time will be determined by balancing how quickly the system should detect and respond to an overtemperature condition against the increased power requirements of longer and/or more frequent monitoring times. In one embodiment, a round robin time of 20 milliseconds, with a 100 microsecond sample time for each temperature sensor may be used, although these values are merely exemplary, and other suitable values could also be used. A suitable debounce time may also be provided. In one embodiment, a suitable debounce time may be 200 microseconds, although other suitable values could also be used. Because the SoC or PMU will know the timing profile associated with the temperature sensing operation, it will be able to ascertain which system triggered an overcurrent warning or overcurrent shutdown by the time at which it occurs.

When the PMU receives an overtemperature warning from overtemperature warning comparator 282, it may take various actions. For example, it may log the overtemperature warning in a memory with the time, temperature recorded (by an analog to digital converter, not shown), component or system responsible for the overtemperature warning, and other information about the operating conditions of the personal electronic device at the time the warning was recorded. (This logging function may also or alternatively be performed by the Soc.) This information may be used at a later time for diagnostics or troubleshooting if the problem persists. When an overtemperature shutdown signal from shutdown comparator 284, is generated, the PMU (and optionally/additionally the SoC) may take further actions. For example, it may log the overtemperature information as described above with respect to the overtemperature warning. More importantly, the PMU may shut down either the component causing the overtemperature condition or the entire personal electronic device. In some embodiments (such as those illustrated in FIG. 3A, discussed below), it may be possible and desirable to shut down an individual system/subsystem, leaving the rest of personal electronic device operational. In other embodiments, because of the interdependent nature of the various subsystems of the portable electronic device, operation of the personal electronic device with one or more subsystems shut down may sufficiently compromise overall operation of the device that a full shutdown is preferable. Additionally, in some embodiments, the nature of the power distribution network of the device may not allow for individual subsystems to be shut down.

In any case, when the PMU shuts down all or part of the personal electronic device because of an overtemperature shutdown condition, it may also cause feedback to be provided to the user indicating that the personal electronic device (or a portion thereof) has been shut down and that the user should return the device for service. This feedback may be provided in the form of visual information on a display of the portable electronic device and/or with audio warnings such as beeps, etc. Additionally, the PMU may be configured to make the shutdown either a one-time event, in which case the personal electronic device (or subsystem) may be restarted after a suitable time delay, or a permanent shutdown, in which case the device (or subsystem) is prevented from restarting without intervention by authorized service personnel. In this latter case, it may be particularly desirable to provide some sort of feedback to the user indicating that the personal electronic device should be taken to in for service.

Monitor Battery Current Profile

The foregoing arrangements for detection and mitigation of circuit faults that may result in an overtemperature condition physiologically impacting a user of a personal electronic device rely on placement of temperature sensors, such as negative temperature coefficient resistors, in the flex circuits of the personal electronic device. However, in some embodiments, such circuit faults may be detected in other ways. More specifically, it may be possible and/or desirable to detect a circuit fault by monitoring a current profile, such as a discharge profile of a battery of the personal electronic device, to detect a current draw that is inconsistent with the expected current draw for a given operating condition. Monitoring the discharge profile of the battery can include monitoring the battery current, instantaneous power, or average power over a longer time period. This monitoring may be performed by a PMU (power management unit), PMIC (power management integrated circuit), or BMU (battery management unit) or by some combination of these devices or another processing system or dedicated circuitry within the portable electronic device.

Figure 3A:
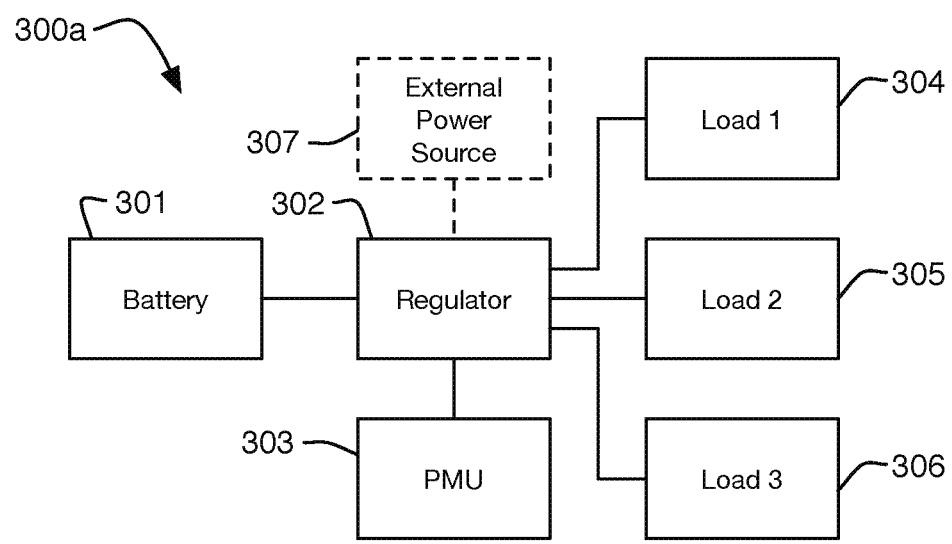
FIGS. 3A and 3B illustrate a power distribution network of a personal electronic device.
Figure 3B:
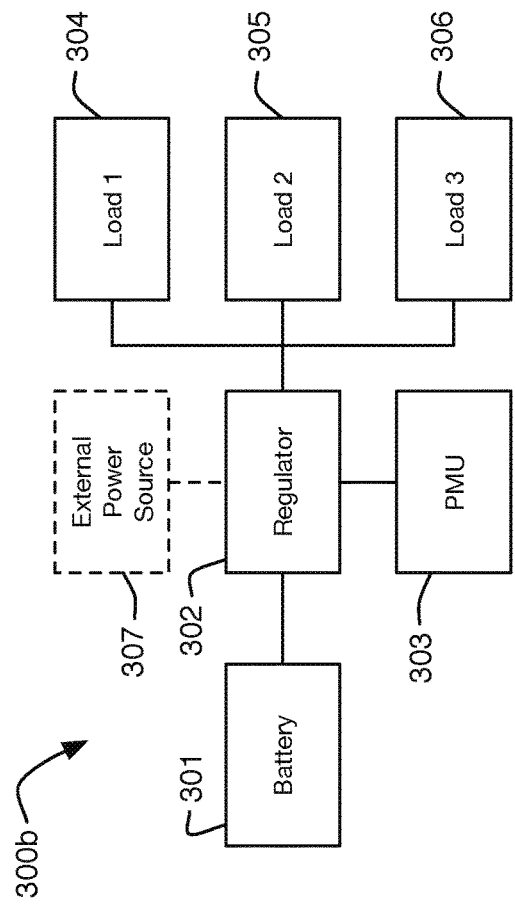

FIGS. 3A and 3B illustrate block diagrams of exemplary power distribution systems 300a and 300b for personal electronic devices. Power distribution systems 300a and 300b each include a battery 301 that provides power for the various loads (304, 305, 306). Power is provided via regulator 302, which may take a variety of forms. Regulator 302 may, for example, be a switching regulator, such as a buck converter, boost converter, buck-boost converter, etc. In some embodiments, regulator 302 may be a bidirectional regulator that can also receive power from an external power source 307 to charge battery 301. Regulator 302 may include an integrated power management unit, or may be controlled by a separate power management unit 303. The power distribution systems 300a and 300b differ in the number of busses used to supply power from regulator 302 to loads 304, 305, and 306. Power distribution system 300a provides a separate bus to each load. In this case, the voltage to each load may be separately regulated, and individual loads may be monitored and/or isolated as desired. Power distribution system 300b provides a combined bus that subdivides to power each load. In the latter case voltage to each load is commonly regulated, and it may be more difficult or impossible to monitor and/or isolate individual loads.

In either case, PMU 303 may be configured to monitor the load current of the regulator. (As noted above, this monitoring could also be performed by another component, such as a battery management unit.) In power distribution system 300a, the load current to each load may be separately monitored. This individual load current may be compared to a threshold to determine whether a particular load is drawing a higher current than it should for a given operating condition. For example, a display may draw a higher current when it is activated and a lower current when it is deactivated. Other components may draw a more continuous load current. In either case, the PMU (or the BMU or SoC) may compare the present current to a threshold associated with the corresponding operating condition to determine whether an overcurrent condition exists. As above, with the direct temperature sensing embodiments, there may be multiple thresholds, for example a relatively lower threshold associated with an overcurrent warning level and a relatively higher threshold associated with an overcurrent shutdown level. When current exceeding a selected threshold is exceeded, the corresponding warning or shutdown condition may be activated, either for the offending load, or for the system as a whole, as discussed above with respect to the direct temperature sensing embodiments.

In power distribution system 300b, it may not be practical or even possible to monitor individual load currents because of the common bus. In this case, an aggregate current for the device may be monitored. This aggregate current may be the output current of the regulator 302 supplied to the loads, or may even be the input current from the battery 301 to the regulator 302. This monitored aggregate current can be compared to the expected aggregate current for the state of the device to determine whether any component is drawing substantially more current than it should, which could be indicative of an electrical fault. Table 1, below, illustrates exemplary power profiles (which may be equated to current draws) to detect an electrical fault when an expected power draw is exceeded. The values given are merely exemplary, and may vary widely depending on a particular implementation.

| Component | Idle Power State | Low Power State | High Power State |
|---|---|---|---|
| Load 1: Touch Display | 0.05 W | 0.25 W | 0.5 W |
| Load 2: CPU | 0.1 W | 0.5 W | 1.0 W |
| Load 3: Communications | 0.05 W | 0.4 W | 0.75 W |

As can be seen from Table 1 and FIGS. 3A and 3B, a personal electronic device may include Load 1 304, a touch sensing display, Load 2 305, a CPU (or, more generally, an SoC), and Load 3 306, a communications system incorporating WiFi, Bluetooth, cellular, and/or other types of networking/communication equipment. Each of these systems may have an idle power state, a low power state, and a high power states. (There may also be other components and/or fewer or additional power states for the various components.) In the illustrated example, touch display 304 may consume 0.05 W when idle, i.e., when not displaying information but available to accept touch input. Touch display 304 may also consume 0.25 W when in a low power state, corresponding, for example to a low screen brightness setting and 0.5 W when in a high power state, corresponding, for example to a high screen brightness setting. CPU or, more generally, SoC 305 may consume 0.1 W in an idle state, 0.5 W in a low power state (corresponding to a light processing load), and 1 W in a high power state (corresponding to a high processing load). Communication module 306 may consume 0.05 W in an idle state, 0.4 W in a low power state (corresponding to receiving data) and 0.75 W in a high power states (corresponding to transmitting data).

By knowing the current operating state, the SoC and/or PMU can determine what is an appropriate level of power draw for the personal electronic device. In embodiments in which power delivered to individual subsystems may be monitored (e.g., FIG. 3A), if any subsystem is drawing more than expected for its current state, a fault may be detected/indicated. Alternatively, in embodiments in which only aggregate current or power supplied may be monitored (e.g., FIG. 3B), if the total system load is greater than anticipated based on the sum of the individual power consumptions for the various subsystems in their present states, a fault may be detected/indicated. It will be appreciated that such an arrangement may not detect/indicated a fault if the current or energy consumption due to a fault is less than the expected current or power consumption for that operating state. For example, if all components are in the idle state, the expected power draw is 0.2 W. If, instead, battery 301 and/or Regulator 302 are delivering 1 W when all components are in the idle state, it may be determined that a component has faulted. Thus, a warning may be logged and/or provided to the user, a shutdown may be performed, or, in some embodiments, it may be desired to perform a restart of the device to determine whether the excessive power draw is caused by a component being hung in a wrong operating mode. If further warnings are logged, then a shutdown may be performed. Additionally, the shutdown may include a lockout as described above and a message may be displayed to the user to return the personal electronic device for service.

It should be noted that the prior example is capable of detecting a fault current corresponding to a power draw of 0.8 W, even though the power draw is less than the personal electronic device might experience at other times. For example, if all systems are operating in the low power state, the expected power draw is 1.15 W, which is more than the 0.8 W triggering the warning or shutdown discussed above. Similarly, if all systems are operating in the high power state, the expected power draw is 2.25 W. It will be further appreciated that different operating states or combinations of operating states will result in different expected power draws. The SoC or PMU can be programmed to look for power draws exceeding the expected power draw by a predetermined threshold amount for all expected combinations of power draw states.

In addition or as an alternative to monitoring instantaneous current draw or instantaneous power consumption for fault detection, the system may be configured to monitor these parameters over time for fault detection. For example, total battery charge consumed over a given time period (i.e., current times time) or total energy consumed over a given time period (i.e., power times time) to detect a fault current. Many personal electronic devices will include some form of "gas gauge" circuit (such as a battery management unit or BMU) that monitors some combination of battery current, temperature, and voltage to determine the battery state of charge. By monitoring the change in state of charge or change in energy consumption over time, the increased charge or energy consumption associated with a faulted device may be detected. As above, such a system may be implemented by having charge consumed per unit time thresholds, such as a first threshold associated with a warning level and a second, higher threshold, associated with a shutdown level.

Figure 4:
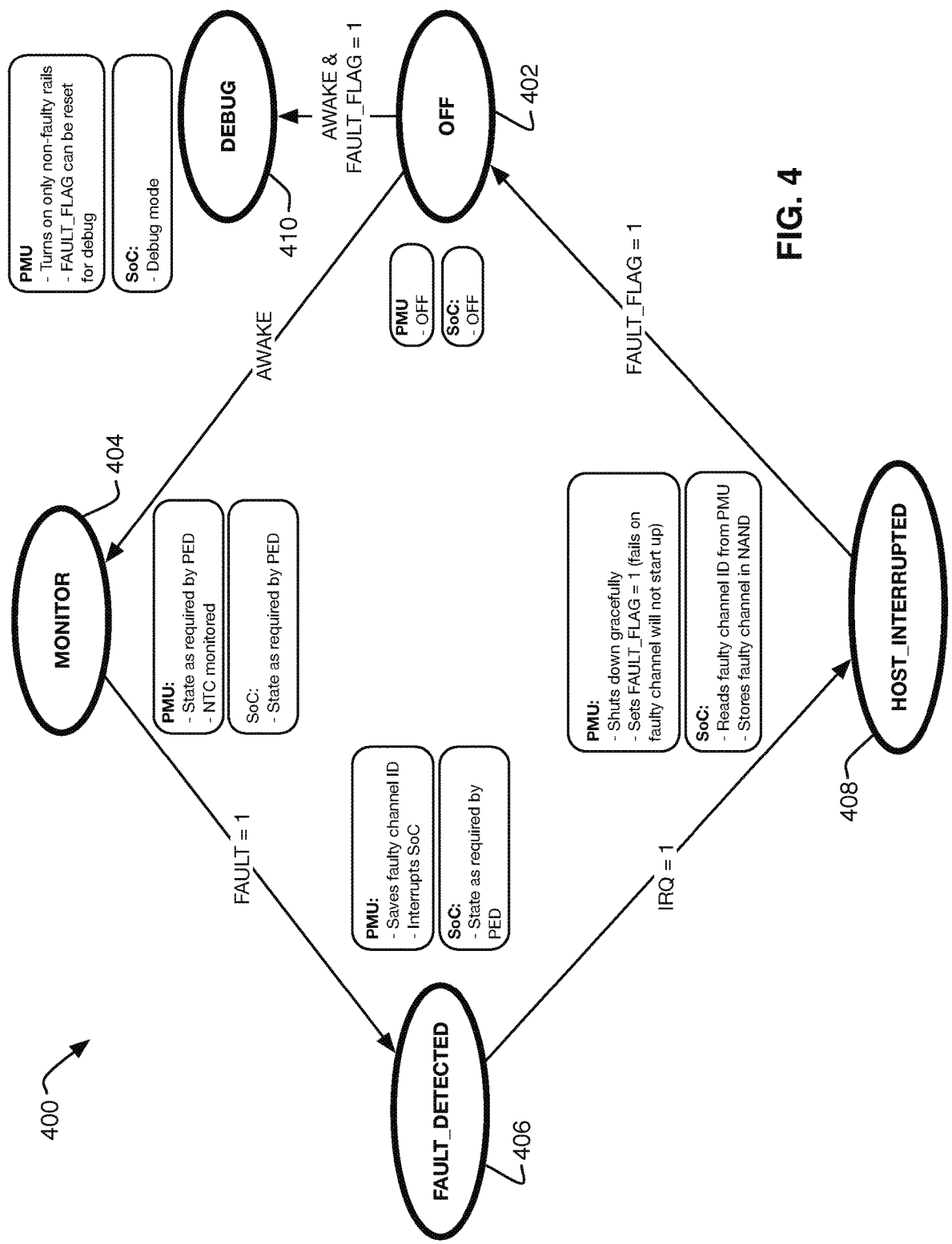
FIG. 4 illustrates a state diagram of a fault detection system for a personal electronic device.

FIG. 4 illustrates a state diagram 400 of a fault detection and mitigation system for a personal electronic device as described above. State diagram 400 is applicable to either sensing arrangement, i.e., the temperature sensor disposed in the flex connector arrangement described with respect to FIGS. 1 and 2 or the aggregate current sensing arrangement described with respect to FIGS. 3A and 3b. The system may start in an off state 402. In the off state, both the PMU and the SoC are powered off. When the device is awakened, if no fault flag has previously been set, the personal electronic device may transition to the monitor state 404. In the monitor state, the PMU may operate as required to supply sufficient power to the personal electronic device ("PED"). The PMU may also monitor the temperature sensors (such as an NTC resistor disposed in the flex) or the aggregate current. The SoC may be in whatever state is required to achieve desired operation of the personal electronic device. (As noted above, in some embodiments, the temperature/current monitoring may be performed by the SoC directly rather than by the PMU.)

If, while in monitor state 404, a current fault is detected (i.e., FAULT=1), the system may transition to the fault detected state 406. In the fault detected state, the PMU (or SoC, depending on which device is doing the monitoring), may save data identifying the faulted system or systems. While in the fault detected state 406 (and before transitioning to the host interrupted state 408), the SoC may continue to operate as required for the present operating condition of the personal electronic device. The PMU may also issue an interrupt signal (IRQ=1) to the SoC, allowing the SoC to respond to the fault as necessary. As described above, this may include a warning, a shutdown, a notification to the user, etc. This interrupt signal (IRQ=1), may cause a transition to host interrupted state 408. In host interrupted state 408, the PMU may set a fault flag (FAULT_FLAG=1) to prevent the device from restarting in to the normal monitor state 404. The PMU may also shutdown if warranted (as described above). Also in host interrupted state 408, the SoC can read the faulted channel data from the PMU and store it in a non-volatile memory (i.e., store in memory an indication of which component or subsystem is faulty).

If the system is in the off state 402 and starts when the fault flag described above is set, the system may transition to the debug state 410. In the debug state, the PMU may power up the non-faulted power rails of the system (based on the faulty channel ID data stored in memory by the SOC in the preceding host interrupted state 408). Additionally, the fault flag set by the PMU may be reset to allow for debugging. Additionally, in the debug state 410, the SoC may be configured and/or programmed to allow for debugging mode that allows diagnostics to be performed and systems to be reset as necessary depending on the repair accomplished, etc.

Described above are various features and embodiments relating to circuit fault detection and mitigation in personal electronic devices. Such regulators may be used in a variety of applications, but may be particular advantageous when used in conjunction with portable electronic devices such as mobile telephones, smart phones, tablet computers, laptop computers, media players, and the like, as well as the peripherals associated therewith. Such associated peripherals can include input devices (such as keyboards, mice, touchpads, tablets, and the like), output devices (such as headphones or speakers), storage devices, or any other peripheral.

Additionally, although numerous specific features and various embodiments have been described, it is to be understood that, unless otherwise noted as being mutually exclusive, the various features and embodiments may be combined in any of the various permutations in a particular implementation. Thus, the various embodiments described above are provided by way of illustration only and should not be constructed to limit the scope of the disclosure. Various modifications and changes can be made to the principles and embodiments herein without departing from the scope of the disclosure and without departing from the scope of the claims.

The invention claimed is:
1. A personal electronic device comprising:
a battery;
a power regulator;
a main printed circuit board having disposed thereon a
 power management unit configured to control the
 power regulator to power the personal electronic device
 from the battery; one or more auxiliary circuits coupled to the main printed circuit board by one or more flexible printed circuits corresponding to the one or more auxiliary circuits; and one or more temperature sensors, wherein each temperature sensor is disposed on one of the flexible printed circuits;

wherein the power management unit is configured to monitor the one or more temperature sensors, provide a warning in response to a monitored temperature exceeding a first threshold, and to cause a shutdown of at least a portion of the personal electronic device in response to the monitored temperature exceeding a second threshold; and wherein the one or more temperature sensors are negative temperature coefficient resistors and the one or more negative temperature coefficient resistors are driven by a digitally programmable current source.

2. The personal electronic device of claim 1 further comprising an analog to digital converter configured to output a digital representation of a voltage across the one or more negative temperature coefficient resistors.

3. The personal electronic device of claim 1 comprising one or more temperature sensing circuits wherein the one or more negative temperature coefficient resistors affect a frequency of an oscillator as a function of temperature.

4. The personal electronic device of claim 1 comprising one or more temperature sensing circuits wherein the one or more negative temperature coefficient resistors affect a gain of an amplifier as a function of temperature.

5. The personal electronic device of claim 1 wherein the power management unit is integral with the power regulator.

6. The personal electronic device of claim 1 wherein the main printed circuit board has disposed thereon a system on a chip in addition to the power management unit.

7. The personal electronic device of claim 1 wherein the personal electronic device is a wearable device.

8. The personal electronic device of claim 2 wherein the personal electronic device is a watch.

9. The personal electronic device of claim 1 wherein the power management unit is configured to provide a warning in response to a monitored temperature exceeding the first threshold by at least one of:
logging an overtemperature warning in a memory of the personal electronic device; and
providing visual or audible feedback to a user of the portable electronic device, the visual or audible feedback indicating an overtemperature warning.

10. The personal electronic device of claim 1 wherein the power management unit is configured to cause a shutdown of at least a portion of the personal electronic device in response to the monitored temperature exceeding a second threshold by at least one of:
logging a shutdown event in a memory of the personal electronic device;
shutting down at least a portion of the personal electronic device; and
providing visual or audible feedback to a user of the portable electronic device, the visual or audible feedback indicating an overtemperature shutdown.

11. The personal electronic device of claim 5 wherein the power management unit is further configured cause the personal electronic device to restart in a debug mode.

12. A method of detecting and mitigating an electrical fault in a component of a personal electronic device, the method comprising:
monitoring, by a power management unit of the personal electronic device, a temperature of at least one temperature sensor disposed on a flexible printed circuit connecting a main printed circuit board of the personal electronic device to an auxiliary circuit of the personal electronic device;

providing, by a power management unit of the personal electronic device, a warning in response to the monitored temperature exceeding a first threshold, providing a warning further comprising:
logging an overtemperature warning in a memory of the personal electronic device; and
providing visual or audible feedback to a user of the portable electronic device, the visual or audible feedback indicating an overtemperature warning; and causing, by a power management unit of the personal electronic device, a shutdown of at least a portion of the personal electronic device in response to the monitored temperature exceeding a second threshold, causing a shutdown further comprising:
logging a shutdown event in a memory of the personal electronic device;
shutting down at least a portion of the personal electronic device; and
providing visual or audible feedback to a user of the portable electronic device, the visual or audible feedback indicating an overtemperature shutdown.

13. The method of claim 12 wherein causing a shutdown further comprises cause the personal electronic device to restart in a debug mode.

14. The method of claim 12 wherein the one or more temperature sensors are negative temperature coefficient resistors.

15. A power management unit configured to monitor one or more temperature sensors disposed throughout a personal electronic device, provide a warning in response to a monitored temperature exceeding a first threshold, and to cause a shutdown of at least a portion of the portable electronic device in response to the monitored temperature exceeding a second threshold, wherein the one or more temperature sensors are negative temperature coefficient resistors driven by a digitally programmable current source.

16. The power management unit of claim 15 further comprising an analog to digital converter configured to output a digital representation of a voltage across the one or more negative temperature coefficient resistors.

17. The power management unit of claim 15 comprising one or more temperature sensing circuits wherein the one or more negative temperature coefficient resistors affect a frequency of an oscillator as a function of temperature.

18. The power management unit of claim 15 comprising one or more temperature sensing circuits wherein the one or more negative temperature coefficient resistors affect a gain of an amplifier as a function of temperature.

19. The power management unit of claim 15 wherein the power management unit is integral with the power regulator.

20. A personal electronic device comprising:
a battery;
a power regulator;
a main printed circuit board having disposed thereon a power management unit configured to control the power regulator to power the personal electronic device from the battery; one or more auxiliary circuits coupled to the main printed circuit board by one or more flexible printed circuits corresponding to the one or more auxiliary circuits; and one or more temperature sensors, wherein each temperature sensor is disposed on one of the flexible printed circuits;

wherein the power management unit is configured to monitor the one or more temperature sensors, and to perform at least one of:

providing a warning in response to a monitored temperature exceeding a first threshold by at least one of logging an overtemperature warning in a memory of the personal electronic device and providing visual or audible feedback to a user of the portable electronic device, the visual or audible feedback indicating an overtemperature warning; and causing a shutdown of at least a portion of the personal electronic device in response to the monitored temperature exceeding a second threshold, by at least one of logging a shutdown event in a memory of the personal electronic device, shutting down at least a portion of the personal electronic device, and providing visual or audible feedback to a user of the portable electronic device, the visual or audible feedback indicating an overtemperature shutdown.

21. The personal electronic device of claim 20 wherein the power management unit is integral with the power regulator.

22. The personal electronic device of claim 21 wherein the power management unit is further configured cause the personal electronic device to restart in a debug mode.

23. The personal electronic device of claim 20 wherein the main printed circuit board has disposed thereon a system on a chip in addition to the power management unit.

24. The personal electronic device of claim 20 wherein the personal electronic device is a wearable device.

25. The personal electronic device of claim 20 wherein the personal electronic device is a watch.

* * * * *